United States Patent
Dawirs et al.

(10) Patent No.: US 10,656,837 B2
(45) Date of Patent: May 19, 2020

(54) INDEX MANAGEMENT IN A FLASH MEMORY

(71) Applicant: Proton World International N.V., Diegem (BE)

(72) Inventors: Michel Dawirs, Wezembeek-Oppem (BE); Guillaume Docquier, Liège (BE)

(73) Assignee: Proton World International N.V., Diegem (BE)

( * ) Notice: Subject to any disclaimer, the term of this patent is extended or adjusted under 35 U.S.C. 154(b) by 336 days.

(21) Appl. No.: 15/444,746

(22) Filed: Feb. 28, 2017

(65) Prior Publication Data

US 2018/0074703 A1    Mar. 15, 2018

(30) Foreign Application Priority Data

Sep. 9, 2016 (FR) ..................... 16 58442

(51) Int. Cl.
| | |
|---|---|
| *G06F 3/06* | (2006.01) |
| *G06F 12/02* | (2006.01) |
| *G11C 16/10* | (2006.01) |
| *G11C 16/16* | (2006.01) |
| *G11C 16/26* | (2006.01) |
| *G11C 16/34* | (2006.01) |

(52) U.S. Cl.
CPC ............ *G06F 3/061* (2013.01); *G06F 3/0655* (2013.01); *G06F 3/0679* (2013.01); *G06F 12/0246* (2013.01); *G11C 16/10* (2013.01); *G11C 16/16* (2013.01); *G11C 16/26* (2013.01); *G11C 16/3427* (2013.01); *G11C 16/3459* (2013.01); *G06F 2212/7207* (2013.01)

(58) Field of Classification Search
CPC ............... G06F 3/00; G06F 3/06–0689; G06F 12/00–16; G06F 2003/0691–069; G06F 2212/00–7211; G11C 16/00–3495
See application file for complete search history.

(56) References Cited

U.S. PATENT DOCUMENTS

| | | |
|---|---|---|
| 5,457,658 A | 10/1995 | Nijima et al. |
| 6,513,095 B1 | 1/2003 | Tomori |
| (Continued) | | |

FOREIGN PATENT DOCUMENTS

| | | |
|---|---|---|
| EP | 2 058 737 A1 | 5/2009 |
| EP | 2 282 266 A1 | 2/2011 |
| WO | 2012/013683 A1 | 2/2012 |

OTHER PUBLICATIONS

JPEG File Interchange Format Version 1.02; Hamilton, Eric; Sep. 1, 1992; retrieved from https://www.w3.org/Graphics/JPEG/jfif3.pdf on Feb. 13, 2019 (Year: 1992).*

(Continued)

*Primary Examiner* — Daniel C. Chappell

(74) *Attorney, Agent, or Firm* — Seed IP Law Group LLP

(57) ABSTRACT

A flash memory management method, wherein: the data to be stored are organized in logic blocks; the memory is divided into pages; and each page is divided into frames, each frame being capable of containing at least one data block and at least one first frame metadata block containing all or part of the index values of the data block in an index tree, an index value corresponding to the address of a frame.

26 Claims, 7 Drawing Sheets

(56) References Cited

U.S. PATENT DOCUMENTS

| | | | |
|---|---|---|---|
| 7,139,864 B2* | 11/2006 | Bennett | G06F 11/1072 |
| | | | 711/103 |
| 7,318,117 B2* | 1/2008 | Lee | G06F 12/0246 |
| | | | 711/103 |
| 8,392,690 B2* | 3/2013 | Chu | G06F 12/0246 |
| | | | 711/203 |
| 8,566,505 B2* | 10/2013 | Kilzer | G06F 12/0246 |
| | | | 711/100 |
| 8,661,190 B2* | 2/2014 | Ou | G06F 12/0246 |
| | | | 711/103 |
| 9,612,955 B2* | 4/2017 | Akella | G06F 16/10 |
| 10,049,122 B1* | 8/2018 | Faibish | G06F 16/188 |
| 10,162,540 B2* | 12/2018 | Dawirs | G06F 3/0619 |
| 2006/0085623 A1* | 4/2006 | Kim | G06F 11/08 |
| | | | 711/202 |
| 2007/0113120 A1* | 5/2007 | Dodge | G06F 11/1068 |
| | | | 714/703 |
| 2008/0109592 A1* | 5/2008 | Karamcheti | G06F 9/5016 |
| | | | 711/103 |
| 2008/0307158 A1* | 12/2008 | Sinclair | G06F 12/0246 |
| | | | 711/103 |
| 2009/0012976 A1* | 1/2009 | Kang | G06F 12/0246 |
| 2009/0172259 A1 | 7/2009 | Prins et al. | |
| 2010/0070688 A1* | 3/2010 | Lin | G06F 12/0246 |
| | | | 711/103 |
| 2010/0169543 A1 | 7/2010 | Edgington et al. | |
| 2011/0022819 A1* | 1/2011 | Post | G06F 12/0246 |
| | | | 711/207 |
| 2011/0066790 A1 | 3/2011 | Mogul et al. | |
| 2011/0238886 A1* | 9/2011 | Post | G06F 12/0246 |
| | | | 711/103 |
| 2012/0166710 A1* | 6/2012 | Ou | G06F 12/0246 |
| | | | 711/103 |
| 2014/0195720 A1* | 7/2014 | Akella | G06F 16/10 |
| | | | 711/103 |
| 2016/0147594 A1* | 5/2016 | Walker | G06F 11/1048 |
| | | | 714/773 |
| 2016/0203075 A1 | 7/2016 | Shin | |

OTHER PUBLICATIONS

Definition transaction; Rouse, Margaret; Apr. 2005; retrieved from https://searchcio.techtarget.com/definition/transaction on Feb. 13, 2019 (Year: 2005).*

A self-adaptive improved µ-Tree index structure for flash-based DBMS; Fang et al.; International Conference on Systems and Informatics; May 19-20, 2012 (Year: 2012).*

Hiffs: A Hybrid Index for Flash File System; Ou et al.; International Conference on Networking, Architecture and Storage; Aug. 6-7, 2015 (Year: 2015).*

µ-Tree: An Ordered Index Structure for NAND Flash Memory with Adaptive Page Layout Scheme; Ahn et al.; IEEE Transactions on Computers, vol. 62, iss. 4, pp. 784-797; Apr. 2013 (Year: 2013).*

A DRAM-flash index for native flash file systems; Ho et al.; Proceedings of the Ninth IEEE/ACM/IFIP International Conference on Hardware/Software Codesign and System Synthesis. Article No. 3; Sep. 29, 2013-Oct. 4, 2013 (Year: 2013).*

Dawirs et al., "Storage in Flash Memory," U.S. Appl. No. 15/380,509, filed Dec. 15, 2016, 25 pages.

French Search Report, dated Dec. 27, 2016, for French Application No. 1654490, 10 pages.

French Search Report and Written Opinion, dated May 29, 2017, for French Application No. 1658442, 10 pages.

"IBM solidDB Version 7.0 Getting Started Guide," 1$^{st}$. ed., 5$^{th}$ revision, 2013, 94 pages.

Kim et al., "LSB-Tree: a log-structured B-Tree index structure for NAND flash SSDs," *Des Autom Embed Syst* 19:77-100, 2015.

Zeinalipour-Yazti et al., "MicroHash: An Efficient Index Structure for Flash-Based Sensor Devices," *FAST '05: 4$^{th}$ USENIX Conference on File and Storage Technologies*, 2005, pp. 31-44.

* cited by examiner

INDEX MANAGEMENT IN A FLASH MEMORY

BACKGROUND

Technical Field

The present disclosure generally relates to electronic circuits and, more specifically, to circuits using a flash memory. The present disclosure more specifically relates to the management of a flash memory.

Description of the Related Art

Flash memories are increasingly used in microcontrollers to store data in non-volatile fashion.

Data storage in a flash memory has various temporal constraints due to the granularity of the operations performed, the writing being performed by word (for example, by word of four bytes), while the erasing is performed by page of several words (from a few tens to a few hundreds of words).

In certain applications, is it desired to ascertain that the transactions performed and stored fulfill an atomicity criterion. The atomicity of a transaction corresponds to ascertaining that data stored in a memory effectively have a processable and uncorrupted state. This amounts to ascertaining that data in the non-volatile memory are either in the state prior to the transaction or in the state following the concerned transaction, but that they are not in an intermediate state.

Transaction atomicity management is particularly used in applications where an interruption of the circuit power supply or the occurrence of an incidental or intentional disturbance may generate the storage of data in a state which makes them either impossible to be subsequently processed or vulnerable in terms of confidentiality or of integrity. For example, in the field of microcircuit cards, it is desired to ascertain that in case of an intentional or incidental untimely pulling out or tearing of a card from the reader where it has been placed, the data contained in a flash memory of the card are reliable. In a circuit integrating a security module, the equivalent of an untimely pulling out corresponds to a powering off of the circuit.

Managing the operations in a flash memory also requires knowing where a piece of data is located as well as knowing where to write new data. Indeed, scanning the entire memory is highly time-consuming.

BRIEF SUMMARY

In an embodiment, a method, comprises: controlling, using a memory management circuit, write operations of blocks of data to data frames of a non-volatile memory, the non-volatile memory being organized into pages with the pages being divided into frames; and controlling, using the memory management circuit, read operations of blocks of data from data frames of the non-volatile memory, wherein each data frame is configured to store: at least one data block; and at least one first metadata word including one or more index values associated with the at least one data block in an index tree, an index value corresponding to an address of a data frame in the non-volatile memory. In an embodiment, for each index level, only values originating from a previous index level are stored in the at least one first metadata word. In an embodiment, for each index level, only values originating from a previous index level and a value corresponding to an address of the current data frame are stored in the at least one first metadata word. In an embodiment, the non-volatile memory is a flash memory and one or a plurality of first index levels are processed in a volatile memory of a circuit containing the flash memory. In an embodiment, all the values of said one or a plurality of first index levels are stored in metadata of each page. In an embodiment, data frames are written sequentially into a page. In an embodiment, a reading of a desired data block comprises: reading a last data frame written into the non-volatile memory; tracing back, from data frame to data frame, by interpreting index values associated with the at least one data block of these data frames, a data frame containing the desired data block. In an embodiment, each data frame is configured to store a second metadata word including a logical identifier of a data block stored in the data frame. In an embodiment, the second metadata word contains a value representative of an error-control code calculated based on at least a data block of the data frame. In an embodiment, writing to a data frame includes storing a value in a third metadata word of the data frame, wherein the value is independent of content of data blocks to be written to the data frame, and is always the same for a given data frame. In an embodiment, said third metadata word has a fixed value for all data frames of the non-volatile memory. In an embodiment, each page comprises at least one page metadata word which contains, when a page is written into, a value of a counter of a number of written pages, the page to be written into being selected as a page having a page metadata word containing a highest value of the counter of written pages from among all pages in the non-volatile memory. In an embodiment, said page metadata word is written to a page before a frame is written into the page. In an embodiment, the method comprises verifying, by the memory management circuit on each starting of the non-volatile memory, an atomicity of a last written data frame.

In an embodiment, a device comprises: a non-volatile memory organized into pages divided into frames; and a memory management circuit, which, in operation, controls: write operations of blocks of data to data frames of the non-volatile memory; and read operations of blocks of data from data frames of the non-volatile memory, wherein each data frame is configured to store: at least one data block; and at least one first metadata word including one or more index values associated with the at least one data block in an index tree, an index value corresponding to an address of a data frame in the non-volatile memory. In an embodiment, the non-volatile memory is a flash memory. In an embodiment, for each index level, only values originating from a previous index level are stored in the at least one first metadata word. In an embodiment, for each index level, only values originating from a previous index level and a value corresponding to an address of the current data frame are stored in the at least one first metadata word. In an embodiment, the device comprises: a volatile memory, wherein one or a plurality of first index levels are processed in the volatile memory. In an embodiment, all the values of said one or a plurality of first index levels are stored in metadata of each page of the non-volatile memory. In an embodiment, data frames are written sequentially into pages of the non-volatile memory. In an embodiment, a reading of a desired data block comprises: reading a last data frame written into the non-volatile memory; tracing back, from data frame to data frame, starting with the last data frame written into the non-volatile memory, based on index values associated with the at least one data block of the respective data frames, to identify a data frame containing the desired data block. In an embodiment, each data frame is configured to store a second metadata word including a logical identifier of a data block stored in the data frame. In an embodiment, the second metadata word contains a value representative of an error-control code calculated based on at least a data block of the data frame. In an embodiment, writing to a data frame includes storing a value in a third metadata word of the data frame, wherein the value is independent of content of data blocks to be written to the data frame, and is always the same for a given data frame. In an embodiment, said third metadata word has a fixed value for all data frames of the non-volatile memory. In an embodiment, each page of the non-volatile memory comprises at least one page metadata word which contains, when a page is written into, a value of a counter of a number of written pages, a page having a highest value of the page metadata word being selected from among all pages in the non-volatile memory for a write operation. In an embodiment, the memory management circuitry, in operation, verifies, on each starting of the non-volatile memory, an atomicity of a last written data frame of the non-volatile memory.

In an embodiment, a system comprises: one or more processing cores, which, in operation, process digital data; a non-volatile memory organized into pages divided into frames; and a memory management circuit, which, in operation, controls: write operations of blocks of data to data frames of the non-volatile memory; and read operations of blocks of data from data frames of the non-volatile memory, wherein each data frame is configured to store: at least one data block; and at least one first metadata word including one or more index values associated with the at least one data block in an index tree, an index value corresponding to an address of a data frame in the non-volatile memory. In an embodiment, the non-volatile memory is a flash memory. In an embodiment, the one or more processing cores, in operation, process transaction data.

In an embodiment, a non-transitory computer-readable medium has contents which cause one or more processing devices to perform a method, the method comprising: controlling write operations of blocks of data to data frames of a non-volatile memory, the non-volatile memory being organized into pages with the pages being divided into frames; and controlling read operations of blocks of data from data frames of the non-volatile memory, wherein each data frame is configured to store: at least one data block; and at least one first metadata word including one or more index values associated with the at least one data block in an index tree, an index value corresponding to an address of a data frame in the non-volatile memory. In an embodiment, for each index level, only values originating from a previous index level are stored in the at least one first metadata word. In an embodiment, a reading of a desired data block comprises: reading a last data frame written into the non-volatile memory; identifying a data frame containing the desired data block based on index values associated with the last data frame written into the non-volatile memory. In an embodiment, the method comprises verifying, on each starting of the non-volatile memory, an atomicity of a last written data frame.

The management of data storage in a flash memory needs being improved, in particular to preserve the atomic character of certain transactions implying updating data in the flash memory.

There also is a need to improve the access to data in a flash memory.

An embodiment may facilitate addressing all or part of the disadvantages of known flash memory management techniques.

An embodiment may ease the search for data in a flash memory.

An embodiment may ease the management of the atomicity of transactions in a flash memory.

An embodiment provides a method of managing a flash memory, wherein:
 the data to be stored are organized in logic blocks;
 the memory is divided into pages;
 each page is divided into frames, each frame being capable of containing at least one data block and at least one first frame metadata block containing all or part of the index values of the data block in an index tree, an index value corresponding to the address of a frame.

According to an embodiment, for each index level, only the values originating from the previous level are stored.

According to an embodiment, for each index level, only the values originating from the previous level except for the value corresponding to the concerned block are stored.

According to an embodiment, one or a plurality of first index levels are processed in a volatile memory of the circuit containing the flash memory.

According to an embodiment, all the values of said one or a plurality of first index levels are stored in metadata of each page.

According to an embodiment, the frames are written sequentially into a page.

According to an embodiment, the reading from a data block comprises at least the steps of:
 reading the last frame written into the memory;
 tracing back, from frame to frame, by interpreting the values of the frames, the frame containing the desired block.

According to an embodiment, a writing of a logic block into the memory goes along with a programming of a second frame metadata word with an identifier of this logic block.

According to an embodiment, the second frame metadata word also contains a value representative of an error-control code calculated at least from the data block of the frame.

According to an embodiment, on writing of a frame, a third frame metadata word is written first with a value, independent from the content of the data to be written, and which is always the same for a given frame.

According to an embodiment, said third metadata word has a fixed value for all the frames in the memory.

According to an embodiment, each page comprises at least one page metadata word which contains, when a page is written into, a value of a counter of the number of written pages, the page to be written into being selected as that having its first page metadata word containing the maximum value of the counter of written pages from among all pages.

According to an embodiment, said first page metadata word is written before the writing of a first frame into the page.

According to an embodiment, on each starting, a memory management circuit verifies the atomicity of the last written frame.

An embodiment provides a flash memory programmed according to a method disclosed herein.

An embodiment provides an electronic circuit comprising a flash memory.

DETAILED DESCRIPTION

Figure 1:
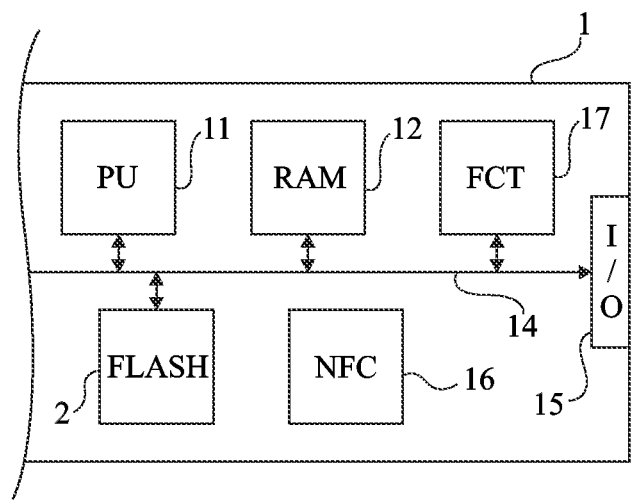
FIG. 1 very schematically shows, in the form of blocks, an embodiment of an electronic circuit.

The same elements have been designated with the same reference numerals in the different drawings, unless the context indicates otherwise.

For clarity, only those acts and elements which are useful to the understanding of the embodiments which will be described have been shown and will be detailed. In particular, the electric behavior of a flash memory during write, read, and erase operations has not been detailed, the described embodiments being compatible with usual flash memory technologies. Further, the applications using an atomicity management have not been detailed either, the described embodiments being here again compatible with usual applications.

FIG. 1 very schematically shows, in the form of blocks, an embodiment of an electronic circuit 1 of the type to which the embodiments which will be described apply as an example.

Circuit 1 comprises:

one or a plurality of processing units 11 (PU), for example, a state machine, a microprocessor, a programmable logic circuit, etc.;

one or a plurality of volatile storage areas 12 (RAM), for example of RAM or register type, to temporarily store information (instructions, addresses, data) during the processings;

one or a plurality of non-volatile storage areas, including at least one flash-type memory 2 (FLASH) for durably storing information, in particular when the circuit is not powered;

one or a plurality of data, address, and/or control buses 14 coupled between the different elements internal to circuit 1; and an input/output interface 15 (I/O) of communication, for example, of serial bus type, with the outside of circuit 1.

Circuit 1 may also integrate a contactless communication circuit 16 (CLF—ContactLess Front-end), of near-field communication type (NFC).

Further, circuit 1 may integrate other functions, symbolized by a block 17 (FCT), according to the application, for example, a crypto-processor, other interfaces, other memories, etc.

The management of the atomicity of transactions in a circuit equipped with a flash memory is particular since the flash memory does not have the same processing granularity according to the type of operation. In particular, the writing is performed word by word (of one byte or of a few bytes) while the erasing is performed page by page. The size of a word generally corresponds to the size of a register receiving the data in series to transfer them in parallel to the memory plane for a write operation. A page is defined as being the minimum size capable of being simultaneously addressed in order to be erased. Typically, a page currently comprises, in a flash memory, 64, 128, 256, 512, or 1,024 bytes.

A flash memory is programmed from an initial state, arbitrarily designated as 1, to states 0 (non-conductive states of the cells). This means that the memory cells should be initialized in a high state (erasing) and that, to store a piece of data (in write mode), action is taken (programming to 0) or not (bit state at 1) on the bit states by data word.

To guarantee the atomicity of transactions, the storage in the flash memory of a piece of data should only be considered as valid once the transaction is over and the data are said to be stable. In practice, atomicity management methods activate an indicator of the processing of data when said data are extracted from the non-volatile memory, and then organize the storage of the updated data, once the processing is over, the processing indicator then switching state. The atomicity may concern a larger or smaller quantity of data according to the nature of the transaction.

The atomicity of transactions is particularly important in the case of bank-type transactions (payment, for example) where it is necessary to ascertain that the information stored in the flash memory, for example, the balance of an electronic purse or of a purchase authorization, or the identifier validating a transaction, is reliably stored.

Generally, to guarantee the atomicity of a transaction, atomicity buffers which are updated with the initial and then with the final information are used for a transfer into the main non-volatile memory.

However, in the case of a flash memory, a difficulty is the erasing procedure, due to its page granularity, which is relatively long as compared with the word-by-word write operation. In particular, there is a need to indicate that an erased page is stable, that is, that it has been integrally erased. Otherwise, a weakness is introduced in the data security. Further, in case a page needs to be erased with a data transfer to a new page, the transfer may result in that stable data present in the page to be erased becoming unstable. This more particularly occurs with large pages (for example, having a size in the order of some hundred words or more) since the latter are more likely to contain older data considered as stable and to be transferred into a new page.

Another difficulty lies in the fact of knowing where a piece of information is located in the memory. Indeed, the logic addressing performed by the execution of a program (of an application using the memory) is different from the physical addressing in the memory. Now, due to the write and erase granularity of a flash memory, it is not desirable, for reasons of space, to store into the actual flash memory an address conversion table. Without this table, it is however necessary to scan (read from) the entire memory until the desired piece of data is found. Another solution is, at the circuit turning-on, to scan (read from) the memory once to generate (calculate) an index or look-up table which is then stored in the volatile memory (RAM). The table should be recalculated for each resetting or powering-on due to the volatile character of the data in a RAM. Not only does this require a non-negligible calculation time for each starting but, also, the calculated table occupies a significant space in the RAM.

In contactless applications, transactions have to be carried out very rapidly due to the fugacity of the communication, which depends on the time during which circuit 1 can communicate with a terminal. Now, managing the atomicity of transactions by using flash memory buffers takes time, due to the erase operations which are necessary to authorize a programming. Further, managing the accesses to the proper data also takes time.

According to the embodiments which will be described, the storage of data into the memory is provided to be organized in specific fashion.

Figure 2:
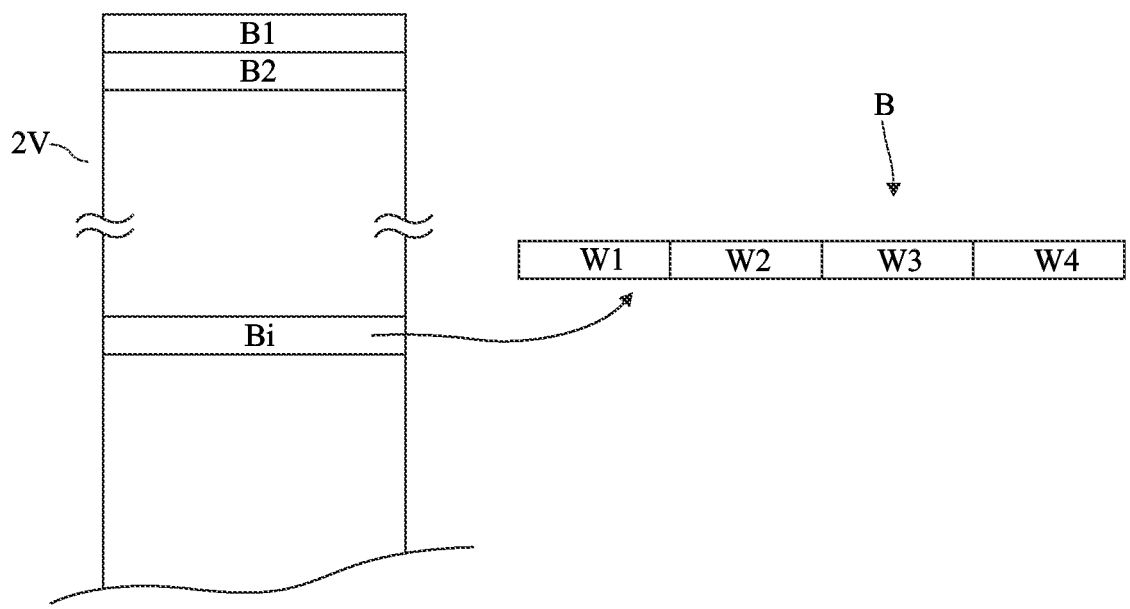
FIG. 2 illustrates an embodiment of a logic organization of data to be stored in a flash memory.

FIG. 2 illustrates an embodiment of a logic organization of data to be stored in a flash memory. In other words, this drawing illustrates the way in which the data are managed by processing unit 11 and the different entities of circuit 1 of FIG. 1 for their storage into the flash memory. Reference is made hereafter to a memory management circuit in charge of organizing its addressing, the writing, the reading, and the erasing, as well as the conversion of logic addresses into physical addresses. Such a management circuit or unit is a circuit programmed according to the implementation of the described method and may be, for example, the processing unit.

According to this embodiment, the assembly of data representing the storage capacity of the flash memory is seen as a single array 2V of data in blocks B1, B2, etc., and each block Bi contains a same number of words W. In the example shown in FIG. 2, each data block Bi is assumed to contain four words W1, W2, W3, and W4. The size of a word corresponds to the write granularity in the flash memory, that is, in practice, from one to a few bytes (for example, four). However, this is an arbitrary example and any other number of one or a plurality of bytes may form a word and any other number of one or a plurality of words may form a block. Thus, the logic division of the flash memory is not performed page by page but by block B having a size independent from the page size.

Data A to be stored into memory 2 comprise an arbitrary number of bytes, independent from the size of a block. From a logic point of view, that is, for processing unit 11, data are defined by a length L(A), that is, a number of bytes, and the position thereof in array 2V of blocks Bi is defined by an offset O(A), that is, an offset from the beginning of array 2V.

Figure 3:
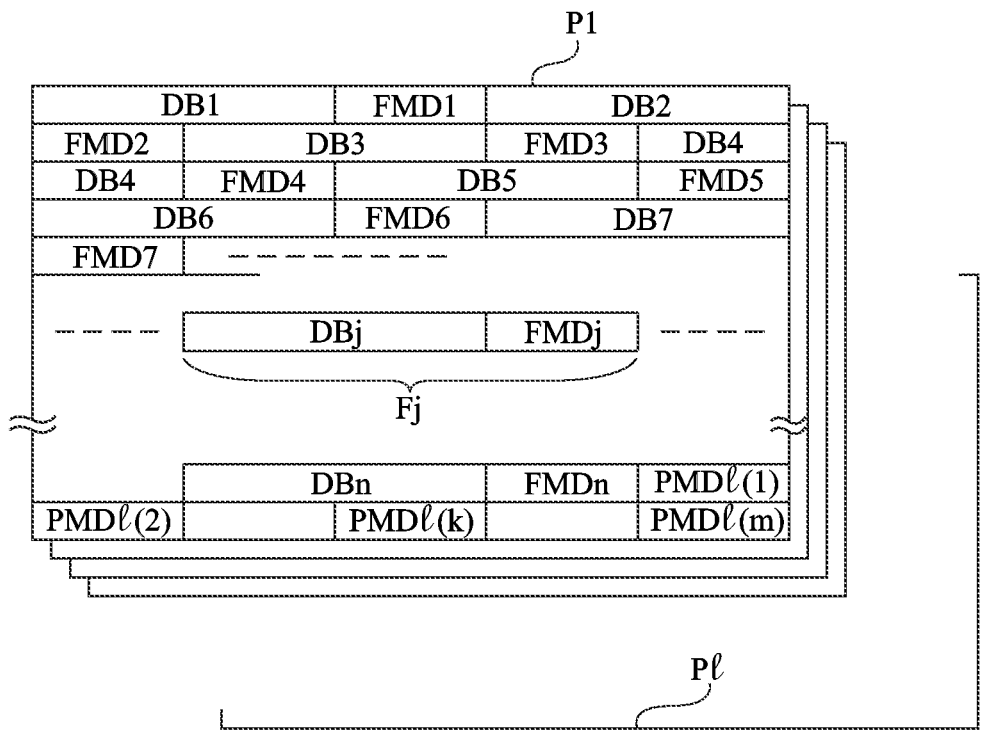
FIG. 3 illustrates an embodiment of a physical organization of data in a flash memory.
Figure 3:
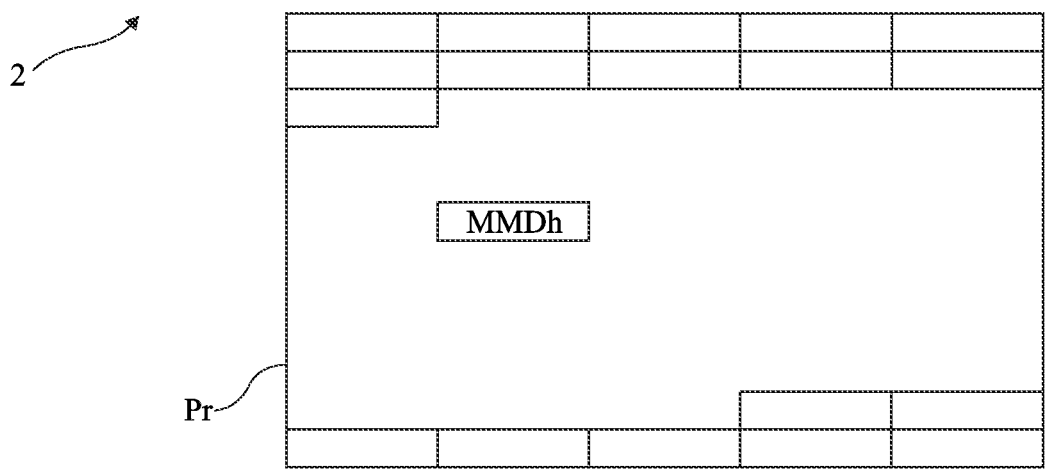

FIG. 3 illustrates an embodiment of a physical organization of data in a flash memory.

The transition between the logic organization (FIG. 2) and the physical organization of the data storage is transparent for processing unit 11 and the other circuits accessing the memory. The unit for managing memory 2 converts, by using an index or look-up table, virtual addresses provided by the different entities into physical addresses. Further, to manage the atomicity, the management unit generates metadata which are also stored in memory 2.

To comply with the erasing constraint, the memory is physically organized in pages P, representing the erasing granularity. The memory is thus divided into r pages P having identical sizes. Each page comprises a same number of words, forming the write (and read) granularity. The pages may be divided in two categories.

A first category comprises pages Pl divided into n frames Fj, each comprising a plurality of data words (assembly DBj) and a same number of frame metadata words FMDj (from one to a few, for example, three). For example, all frames comprise a same number of data words. Each page Pl further comprises a number m (from a few to a few tens) of page metadata words PMDl(k) independent from the frames. The number of data words of each frame may correspond to an integral multiple (at least 1) of the number of data words of each block DB of the virtual organization of the memory. Thus, a frame Fj contains a data block DBj and frame metadata FMDj. In FIG. 3, block DBj followed by metadata FMDj has been illustrated for each frame. However, as will be seen hereafter, part of the metadata may be written at the beginning of each frame Fj.

A second category of pages, by a much smaller number than the number of pages Pl of the first category, only contains memory metadata words MMDh.

As illustrated, the second category comprises a single page Pr and the first category thus comprises r-1 pages Pl.

As a variation, only pages of the first category are provided.

According to an example embodiment, a page contains 1,024 bytes, r-1 pages Pl of the first category, each containing 25 frames of 10 words each, and 6 page metadata words PMDl are provided. Each frame Fj contains a block DBj, of eight data words W, and three frame metadata words FMDj. Further, a single page Pr of memory metadata words MMDh is provided.

This is a specific example and other granularities may be provided. All words may have the same size, representing the write granularity in the memory. In particular, logic blocks Bi of variable size (number of words), which are then capable of being distributed into a plurality of blocks DBj in a plurality of frames, may be provided. As a variation, metadata words have a different size to gain space, particularly if the data have a small size.

Frame metadata FMDj contain at least one word FCONST (for example, a single word FMDj(1)) of fixed value, which may be identical whatever the value of the data contained in block DBj, and at least one word (for example a single word FMDj(2)) containing the number(s) (identifier(s) i) of the virtual block(s) Bi written into real block DBj. Word FMDj(2) also contains a state indicator FW (end of writing) of block DBj and a CRC-type error-control code. The frame metadata are used for the frame atomicity, that is, they indicate whether the block DBj contained in the frame is stable or not. The two frame metadata words FMDj(1) and FMDj(2) are used for the atomicity management.

Frame metadata FMDj also contain at least one word (for example, a word FMDj(3)) containing one or a plurality of index values. These index values enable, from the last updated frame, to trace back the desired block.

Figure 4:
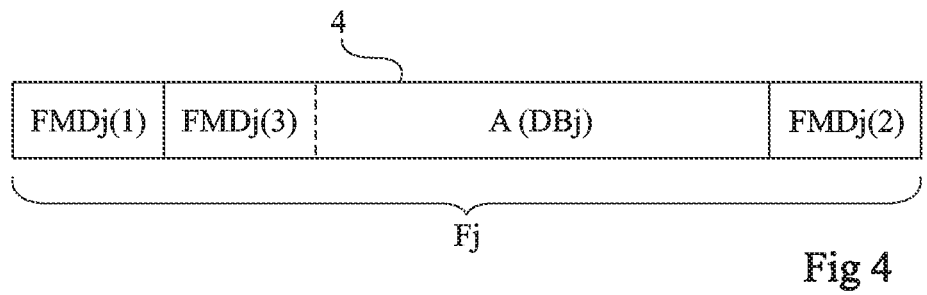
FIG. 4 schematically illustrates an embodiment of a frame structure of the memory of FIG. 3.

FIG. 4 schematically illustrates an embodiment of a structure 4 of frame Fj, assuming three metadata words FMDj.

According to this embodiment, metadata word FMDj(1) of fixed value FCONST is written first, followed by metadata or index word FMDj(3), the words of data A, and then metadata word FMDj(2). As a variation, index word FMDj(3) is stored between the words of data A and metadata word FMDj(2). The CRC code contained in word FMDj(2) may be, for example, a CRC of words FMDj(1) and FMDj(3) and of block DBj. Due to the use of a fixed value for word FMDj(1), it will be possible to ascertain that there has been no untimely pulling out or attack at the beginning of the writing of the frame, for example, an attempt to modify the content of block DBj during an attack. The value is fixed, that is, it is the same for a given frame, but may vary from one frame to another. In an embodiment, for simplification, the value may be the same for all memory frames.

Metadata FMDj(3) are then used, during read operations, to find the data more rapidly, without having, either to calculate a complete look-up table in a RAM at the starting, or to scan the entire flash memory. Advantage is actually taken from the specificities of the storage in a flash memory to transform their constraints into advantages. Indeed, the fact for the writing into the memory to be performed page by page and frame by frame enables, from a reading of the last frame and index metadata FMDj(3), to trace back the frame containing the updated value of any block. Index metadata FMDj(3) represent, for each frame, one or a plurality of words according to the size of the index (of the total number of logic blocks in the system).

Figure 5:
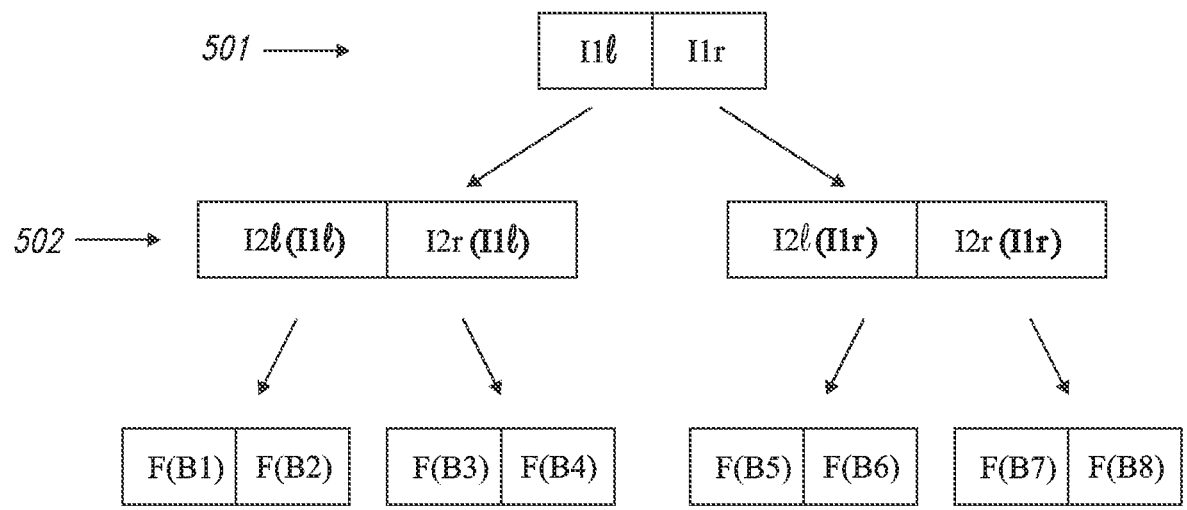
FIG. 5 very schematically shows an example of structure of an index for searching for data in a flash memory.

FIG. 5 very schematically shows an example of a structure of an index having its values forming metadata FMDj (3). As illustrated, the existence of eight blocks B1 to B8 and the use of a binary index to define the respective positions of the last updated blocks are assumed.

Each writing of a block Bi into a frame has three associated index levels.

First level index 501 comprises a pair of values I1$l$ and I1$r$ representing the addresses of two frames containing the last updated blocks respectively from among blocks B1 to B4 and B5 to B8. One of the two frame addresses thus is that of the current frame. Assuming, for example, that the writing concerns block B4 (i=4), value I1$l$ corresponds to the address of the current frame.

Second-level index 502 comprises a pair of values I2$l$ and I2$r$ representing the addresses of the two frames containing the last updated blocks respectively from among the two pairs of blocks B1-B2 (I2$l$(I1$l$)) and B3-B4 (I2$r$(I1$l$)) or B5-B6 (I2$l$(I1$r$)) and B7-B8 (I2$r$(I1$r$)) comprising block Bi. Continuing with the example of FIG. 4, index 502 contains the addresses of the two frames containing the last updated blocks respectively from among block B1, B2, and B3, and B4. Here again, one of the two address frames (here, value I2$r$) corresponds to the address of the current frame.

Third-level index I3 comprises a pair of values I3$l$ and I3$r$ representing addresses F(Bi) of the two frames containing the last updated blocks respectively from among the two blocks of each pair of blocks concerned by the index of previous level (here, 2). Continuing with the example of FIG. 5, index I3 contains addresses F(B3) and F(B4) of the two frames containing the last updated blocks from among block B3 to B4. One of the two address frames (here, value FB(4)) corresponds to the address of the current frame.

Such an organization enables, in read more, by simply reading frame metadata FMDj(3), to trace back, from frame to frame, that containing the desired block. In the example of a three-level index, the maximum number of frames needing to be read to find the block is three.

It is started by identifying the address of the last written frame and by verifying that the content of the last written frame is valid. Embodiments for searching for the last written frame and validating its content will be discussed hereafter. However, the described index technique more generally applies to other flash memory storage applications which do not necessarily comprise verifying the atomicity.

For the search for block Bi, frame metadata FMDj(3) are read from the last written frame.

The value of first level I1 corresponding to the searched block (for example, for block B4, value I1$l$) is examined. If this value corresponds to the current address, the second-level value is examined. Otherwise, the examination of the current frame is stopped and the first-level value is adopted as the next frame address to be read and it is returned to examining the first-level index value. Here, this value necessarily corresponds to the current address. Accordingly, it may as a variation be directly proceeded to the examination of the second-level value.

Then, if second-level value I2 of the read frame corresponding to the searched block (here, I2$r$(I1$l$)) corresponds to the current address, the third-level value is examined.

Otherwise, the examination of the current frame is stopped and the second-level value is adopted as the next frame address to be read, and it is returned to reading the first-level index value. Here, the first-level value, as well as the second-level value, necessarily correspond to the current address. Accordingly, it may as a variation be directly proceeded to the examination of the third-level value.

Finally, if third-level value I3 of the read frame corresponding to the searched block (here, F(B4) or I3$r$) corresponds to the current address, block Bi is read from the current frame. Otherwise, the third-level value is adopted as the address of the frame containing the searched block Bi. Even though a verification may be performed by examining the index values of the new read frame, it is in principle certain that it is the right one.

According to an alternative embodiment, advantage is taken from the fact that one of the two addresses stored in each index level corresponds to the address of the current frame. It may thus be avoided to store it. Thus, only one index value per level is stored (more generally, one value less than the number of branches of the index tree towards the next level), that is, that which corresponds to the address of the other block sub-assembly (taking the example of block B4, only values I1$r$, I2$l$(I1$l$), and F(B3) are stored). This facilitates decreasing the size of the index storage and thus the frame size.

Although a binary tree, which is the best compromise in terms of storage space necessary for the index, may be used, this principle may also be more generally applied to any tree division. The number of values of each level (of branches between the current level and the next level) is further not necessarily the same for all levels. This choice depends on the desired index value size and on the desired number of indexes. For a given number of blocks, the larger the number of blocks, the larger the maximum number of frames to be read to reach the block, but the smaller the frame size. The larger the number of values per level, the faster the reading (the right block is found more rapidly), but the larger the frame size.

According to an alternative embodiment of the index, a portion of the index is used in the RAM and a portion (one or a plurality of last levels) of the index is used in the flash memory as described hereabove. Even if the storage of the index in the RAM imposes storing all the values, that is, the complete level, since the number of values per level increases as the level increases, it may be chosen to store the first levels in the RAM. For example, to store 1,024 blocks with a binary index, the five first tree levels contain a total of 32 values while the five next levels contain a total of 992 values. An advantage is that this decreases the read time since this decreases the maximum number of frames to be read from the flash memory.

In this case, all the values of these first levels are stored in the metadata of each new page of the flash memory. This enables to avoid having to analyze all the pages at the starting to reconstruct the index. Indeed, it is sufficient to copy the index metadata of the current page and then to analyze the programmed frames (in the current page) to restore the entire index.

According to an embodiment, page metadata PMDl (FIG. 3) contain at least:

a word PMDl(1) indicating that the page has started being written into and that it is no longer blank;

optionally, a word PMDl(2) indicating that the page is full;

a word PMDl(3) indicating that the next page has been erased (and is thus blank);

a word PMDl(4) indicating the fact that the page is obsolete, that is, that none of the frames contains a still useful block (in other words, that all the blocks in the page have already been subsequently modified in other pages); and a word PMDl(5) containing a page order number, that is, the value of a counter PWN of the number of written pages.

The page metadata according to this example are used to indicate the switching from one page to another and to allow an atomicity recovery at the circuit starting or resetting. The words are not necessarily physically in this order in the page.

According to another embodiment, the page metadata further contain, in addition to or instead of word PMDl(3) indicating that the page has been erased, a word PMDl(6) indicating the number of erase operations which have been applied to the page.

According to an embodiment, the page metadata contain one or a plurality of additional words PMDl(7) to store the index table of one or a plurality of first index levels.

Each time, when a block is traced back from frame to frame in read mode, it is passed to another page, the first levels are read from page metadata PMDl(7), and they are stored in the RAM to start by interpreting the first levels from a reading from the RAM. The link between logic sizes and the physical organization of the memory is that all words have the same size. Remember that, when a word is blank (erased), all its bits are in a first state (e.g., designated as high or 1). The programming of a word to store a value therein comprises selecting the bits of the bytes of the word which should switch state and be written (e.g., switch to the low or 0 state). The programming of a flag or indicator comprises programming the bit(s) of the byte to the state corresponding to the low state. As discussed above, once a bit of a word has been written or programmed to state 0, the content of the word cannot be modified, unless the entire page is erased and reprogrammed.

The writing of the data into the memory is performed block by block as they are being received, and successively into each page. Thus, in case of successive writings of a same logic block (for example, the value of a counter), this same data block Bi may end up being written a plurality of times into the memory with different values along the write operations. This takes part in the resolution of the atomicity problem since, from the time when a piece of data A will have been written once with a first value, one may always, in subsequent write operations, return to the previous value representing the stable state in case of a writing problem for the current value.

However, on the side of logic memory 2V, a same piece of data A is "stored" in the same block Bi (or the same blocks). Thus, identifier i (the address) of block Bi in the logic memory enables to find the physical block(s) DBj of memory 2 containing data A (containing the successive values of data A).

For simplification, the operation is discussed hereafter by arbitrarily assuming that the considered data A occupy one and the same block Bi and that blocks DBj have the size of a block Bi. However, all that is described more generally applies to the practical case where data A may occupy a plurality of blocks or a portion of a block and to different sizes of blocks Bi and DBj.

Figure 6:
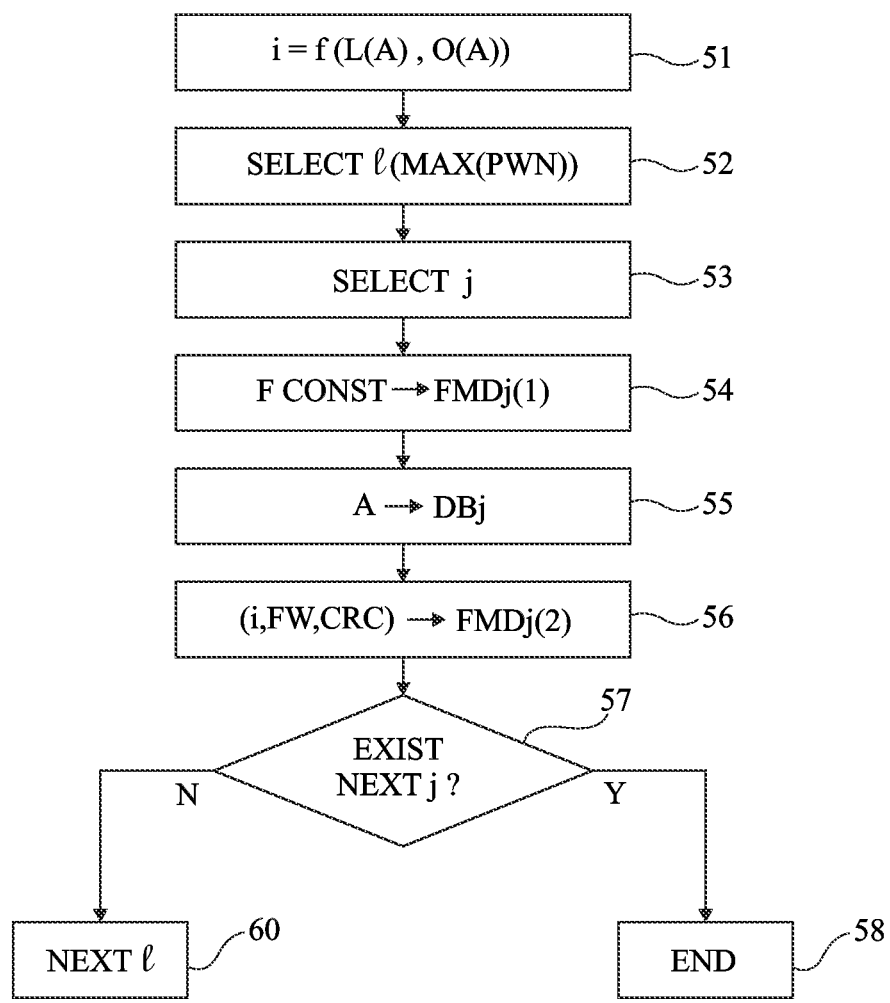
FIG. 6 is a block diagram illustrating an embodiment of a data writing into the memory.

FIG. 6 is a block diagram illustrating an embodiment of the writing of data A into memory 2.

Based on length L(A) and on offset O(A) of data A in virtual array 2V (FIG. 2), the memory management circuit determines (block 51, i=f(L(A), O(A))) the identifier i of the block DBi containing the data.

Then (block 52, SELECT l(MAX(PWN))), the page Pl having the highest number of written pages PWN is selected by scanning (reading) the corresponding words PMDl(5) of the page metadata.

Then (block 53, SELECT j), the first frame Fj sequentially available in page Pl is identified. Such a selection is for example performed by successively scanning the frames until reaching the first one which has a word FMDj(1), intended for fixed value FCONST, which is not programmed. As a variation, second metadata word FMDj(2) is read and the first frame having its end-of—writing FMDj indicator FW at state 1 or having a block identifier i which is not programmed is selected. It is assumed in this example that a new page is opened at the end of the writing of the last frame of a page. Accordingly, an available frame is necessarily found at step 53.

As a variation, if no frame is free, this means that the page is full. A new page opening subroutine is then executed. This subroutine will be discussed hereafter in relation with FIG. 7.

Once frame Fj has been selected, it is started by writing (block 54, FCONST→FMDj(1)), into frame Fj, the first fixed metadata word FMDj(1). It actually is the first logically-written word. Physically, the words may be in a different order in the frame. Then (block 55, A→DBj), piece of data A is written into block DBj, after which (block 56, (i, FW, CRC)→FMDj(2)) second metadata word FMDj(2) is written with identifier i, end-of-writing indicator FW, and the CRC of the first words (FMDj(1) and DBj) of the frame. Index metadata word(s) FMDj(3) are also written, and may be written before word FMDj(2), so that the index is taken into account in the atomicity verification.

It is then checked whether the page is full, that is, whether there exists a frame Fj available for the next write operation (block 57, EXIST NEXT j?). If there does (output Y of block 57), the writing ends (block 58, END). In the case where data A may represent a plurality of blocks DBi, it is returned to step 53 to write into the next frame. In a more general case where the frames have a variable size and where the space available at the end of the page is not sufficient to store the next frame, either a free space is left, or the frame is divided in two and one portion is stored on the current page while the other portion is stored in the next page.

If there is not an available frame on the page (output N of block 57), that is, if there is no further available frame, a next page is prepared for the next write operation (block 60, NEXT 1). For simplification, the case where the next page is prepared is considered (index 1 incremented by one) but it may more generally be provided to link a plurality of pages together in order to accelerate the speed of the writing of a plurality of blocks with no intermediate erase operation. In this case, it is provided to skip one or a plurality of pages when a page is full.

Figure 7:
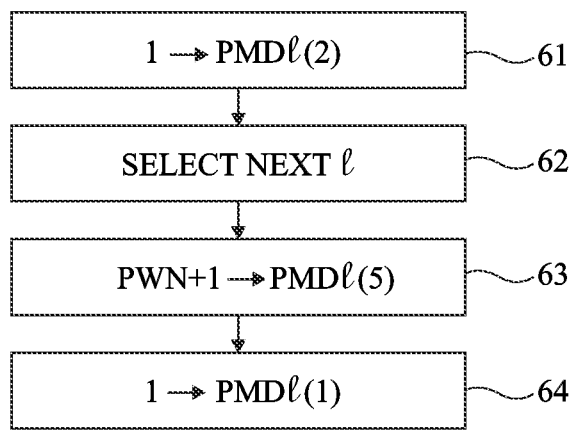
FIG. 7 is a block diagram illustrating an embodiment of a preparation of a next page for a write operation when a current page is full.

FIG. 7 is a block diagram illustrating an embodiment of a preparation of a next page for a write operation when a current page is full.

It is started (block 61, 1→PMDl(2)) by closing the current page, that is, by programming its end-of-page or full page metadata word PMDl(2). Then (block 62, SELECT NEXT 1), the next page Pl which is available, that is, obsolete, is selected. The value of the number of written pages, incremented by 1, is then programmed (block 63, PWN+1→PMDl(5)) in the corresponding page metadata word PMDl(5) and the page opening indicator is also programmed (block 64, 1→PMDl(1)).

With such a process of writing into memory 2, one can, in read mode, find the last atomic transaction for each piece of data.

Figure 8:
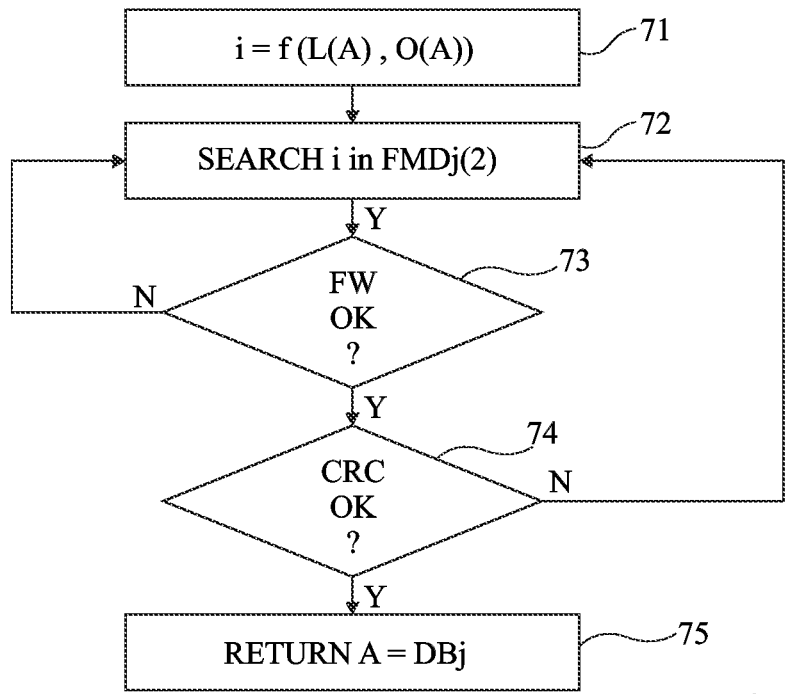
FIG. 8 is a block diagram illustrating an embodiment of a data reading from the memory.

FIG. 8 illustrates, in the form of block diagrams, an embodiment of an atomic reading of a piece of data A from memory 2.

Based on length L(A) and on offset O(A) of data A in virtual array 2V, the memory management circuit determines (block 71, i=f(L(A), O(A))) the identifier i of the block Bi containing the data. The reading from the memory is performed as illustrated hereabove, back from frame to frame from the last written frame of the last written page (block 72, SEARCH i in FMDj(2)).

For each read frame, the state indicator FW which indicates whether the frame writing has ended with no untimely pulling out indicating, in principle, whether the data are stable or not, is verified (block 73, FW OK?).

If the state indicator is not valid (output N of block 73), the frames are then scanned back (block 72) all the way to that containing the previous version of data block DBj.

If the state indicator is valid (output Y of block 73), the error code is verified (block 74, CRC OK?) by recalculating a CRC on the data present in the first metadata word FMDj(1) and in the data block DBj.

If the calculated code is identical to the stored code (output Y of block 74), data block DBj is valid and the reading provides (block 75, RETURN A=DBj) the value of block DBj as being data A, and thus as the content of virtual block Bi.

If the CRC code is not confirmed (output N of block 74), this means that the data are not reliable. The memory is then scanned back (block 72) to find the previous writing of the data, which amounts to searching for the last atomic transaction. To scan back the previous frames, the index is restored based on the metadata of the most recent page (the most recently written into) and on the frames written into this most recent frame.

As a variation, when a frame having an erroneous CRC is identified (output N of block 74), an indicator that the frame is polluted is written into the second metadata word FMDj (2). This saves some time at the next reading of data A since it avoids recalculating the CRC before tracing back the next occurrence.

Figure 9:
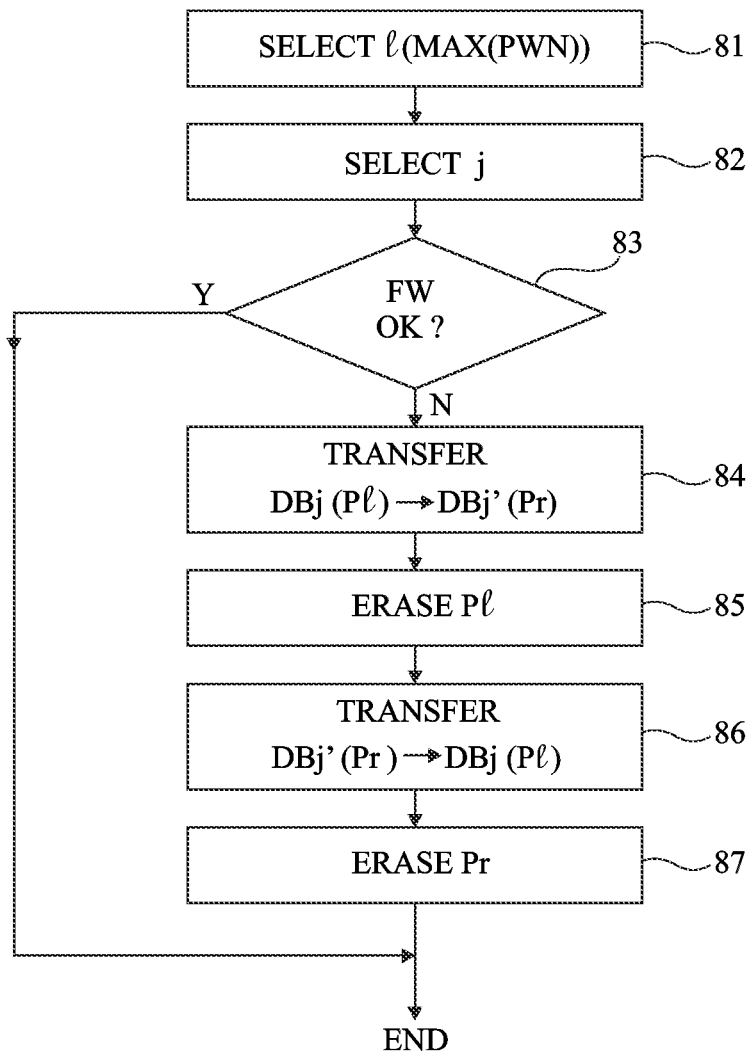
FIG. 9 is a block diagram illustrating an embodiment of an atomicity recovery at the level of a page.

FIG. 9 is a block diagram illustrating an embodiment of an atomicity recovery at the level of a page.

In practice, this process is carried out at the starting or on resetting of the circuit, which amounts to verifying the atomicity after each incidental or intentional untimely pulling out or powering off.

It is started by selecting (block 81, SELECT l(MAX (PWN))) the page having the maximum value of the counter of the number of written pages. Then, the last frame written in this page is selected (block 82, SELECT j). The second metadata word FMDj(2) is then read and it is verified (block 83, FW OK?) that write indicator FW is correct (is programmed). If it is (output Y of block 83), there is no atomicity issue and the powering off or resetting has occurred while the write processes into the flash memory had ended. It is then proceeded to the normal operation, that is, the atomicity verification process is over (END). As a variation, to make sure that there has been no untimely pulling out at the end of the writing and to guarantee the stability of word FMDj(2), the same value is reprogrammed in word FMDj(2).

If it is not (output N of block 83), this means that an untimely pulling out (power cut-off or resetting) has occurred during a writing into the flash memory. According to an embodiment, page Pr is then used to transfer (block 84, TRANSFER DBj(Pl)→DBj'(Pr)) all the valid frames of page Pl into page Pr. Then, page Pl is erased (block 85, ERASE Pl). The different steps of the copying, to page Pr, and then of the copying again from page Pr, are validated by metadata words in page Pr to make sure that, in case of an untimely pulling out during the recovery procedure, the started procedure is effectively continued and that it is not started over from the beginning of the untimely pulling out procedure at the risk of definitively losing the data still valid in page Pl.

According to an embodiment, page Pr is a dedicated memory page. An reverse transfer (block 86, TRANSFER DBj'(Pr)→DBj(Pl)) of the data temporarily stored in page Pr into the erased page Pl is then carried out. The page metadata are then also rewritten. Finally, page Pr is erased (block 87, ERASE Pr) to be ready for a next use.

According to another embodiment, page Pr is any available page. In this case, it is not necessary to transfer the data into page Pl after the erasing.

In an embodiment, the process of FIG. 9 also comprises verifying the atomicity of the page metadata. To achieve this, at a restarting and on the last written page, an error-correction code stored in one of the page metadata words PMDl(k) is verified.

In an embodiment, before step 84, the metadata words PMDl(2) of all the pages which have been written into after the frame Fj selected at block 82 are written as indicating a full page. Thus, these pages cannot be used without being erased.

According to the variation where only first-category pages are used, it may be avoided to copy the reliable frames into a new page after the detection of an erroneous frame. Indeed, the critical frame will anyway not be considered in read mode and the previous reliable data will be read. However, this decreases the capacity of the memory in terms of number of untimely pulling outs that it can withstand since lost frames are kept.

The number of available (erased) pages is at least two to enable to erase a page. When there is no further available page (other than the two minimum pages), one of the written pages is selected, for example the page where the number of written frames is minimum. This page to be erased is then scanned by verifying its frames and those which contain the last reliable states of blocks Bi. All these blocks are transferred (written) as described in relation with FIG. 6 into one of the available pages. Thus, at most n blocks are transferred (in practice, there are at least certain frames containing obsolete data so that this transfer results in available frames in this page). Once the transfer is over, the original page is erased. Once the erasing has been performed, the erased page indicator PMDl(4) is programmed.

As a variation, a minimum number of pages, greater, for example, than three or four, is set to have more available frames in order to store a larger number of transactions without requiring an erasing.

Figure 10:
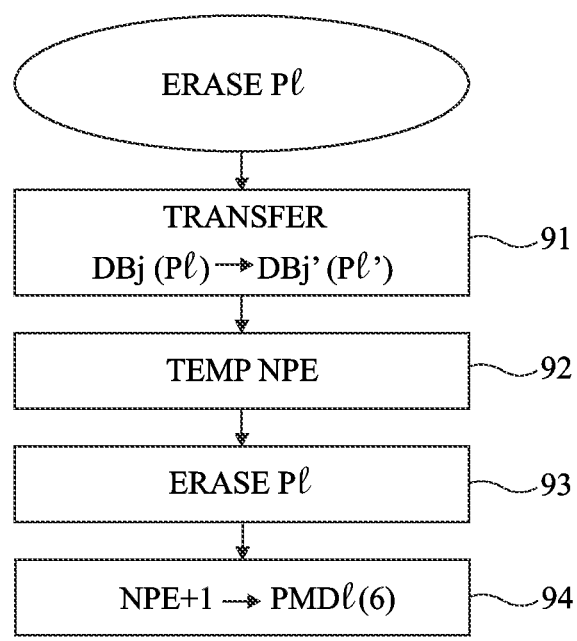
FIG. 10 is a block diagram illustrating an embodiment of a selection of a page to be erased.

FIG. 10 is a block diagram illustrating another embodiment of a selection of a page to be erased.

To erase a page Pl (ERASE Pl), it is started, as indicated hereabove, by transferring (block 91, TRANSFER DBj (Pl)→DBj'(Pl')) all the data blocks DBj of page Pl having their content representing the last stable value of a piece of data into a block DBj'(Pl') of one of the available memory pages. A counter NPE of the number of page erase operations is stored (block 92, TEMP NPE) in a metadata word of the previous page, after which page Pl is erased (block 93, ERASE Pl). Once the erasing has been performed, metadata word PMDl(6) is programmed (block 94, NPE+1→PMDl (6)) to the value of the number of erase operations incremented by one.

According to this embodiment, the selection of the page to be erased does not necessarily correspond to the page having the minimum value of the number of written pages but to that having the minimum value of written pages from among the pages having been submitted to a lesser number of erase operations.

The application of this embodiment enables to optimize the lifetime of the flash memory by optimizing the homogeneity of the number of erase operations among the number of pages. Indeed, if there had been no atomicity recovery process, the page having the maximum value of the number of written pages would be among those having been erased a smaller number of times. However, since the application of the atomicity recovery process at the level of a page results in a transfer, with the same value of number of written pages, into an available page, this does not necessarily correspond, particularly in case of a large number of implementations of the atomicity recovery.

It should be noted that, while this second aspect can be combined with the first one, it can also be more generally implemented in any flash memory management method.

Another advantage of an embodiment is that in case of an implementation of the atomicity recovery process at the level of a page such as described in relation with FIG. 9, there is a risk for the error to be at the level of the number of written pages, in which case this page risks, without the implementation of the counter of the number of erase operations, never being erased.

An embodiment may advantageously improve the management of a flash memory for the processing of operations having to respect an atomicity criterion.

An embodiment may easily enable to trace back the last atomic value of a piece of data.

An embodiment may facilitate fast searching for the page containing the searched data without taking too much space in the RAM with an address look-up table.

For the case where the atomicity is not desired to be verified at the frame level, the frame metadata may only contain the index information. In this case, the atomicity verification may or may not be maintained at the page level.

Various embodiments have been described. Various alterations, modifications, and improvements will readily occur to those skilled in the art. Further, the practical implementation of the described embodiments is within the abilities of those skilled in the art based on the functional indications given hereabove and by using circuits usual per se. Particularly, the organization of the memory addressing and the generation of the signals adapted to the control of said memory and to this addressing use techniques usual per se.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
controlling, using flash memory control circuitry, write operations of blocks of data to data frames of a non-volatile flash memory, the non-volatile flash memory being organized into pages with the pages being divided into frames, wherein data frames are written sequentially into a page; and
controlling, using the flash memory control circuitry, read operations of blocks of data from data frames of the non-volatile flash memory, wherein each data frame is configured to store:
at least one data block; and
at least one first metadata word including one or more index values associated with the at least one data block in an index tree having a plurality of levels, an index value corresponding to an address of a data frame in the non-volatile flash memory, wherein
for each index level of the index tree, only values originating from a previous index level are stored in the at least one first metadata word; and
each page comprises at least one page metadata word which contains, when a page is written into, a value of a counter of a number of written pages, the page to be written into being selected as a page having a page metadata word containing a highest value of the counter of written pages from among all pages in the non-volatile flash memory.

2. The method of claim 1 wherein a value corresponding to an address of the current data frame is stored in the at least one first metadata word.

3. The method of claim 1 wherein one or a plurality of first index levels are processed in a volatile memory of a circuit containing the non-volatile flash memory.

4. The method of claim 3 wherein all the values of said one or a plurality of first index levels are stored in metadata of each page.

5. The method of claim 1 wherein a reading of a desired data block comprises:
reading a last data frame written into the non-volatile flash memory;
tracing back, from data frame to data frame, by interpreting index values associated with the at least one data block of the respective data frames, a data frame containing the desired data block.

6. The method of claim 1 wherein each data frame is configured to store a second metadata word including a logical identifier of a data block stored in the data frame.

7. The method of claim 6 wherein the second metadata word contains a value representative of an error-control code calculated based on at least a data block of the data frame.

8. The method of claim 7 wherein writing to a data frame includes storing a value in a third metadata word of the data frame, wherein the value is independent of content of data blocks to be written to the data frame, and is always the same for a given data frame.

9. The method of claim 8 wherein said third metadata word has a fixed value for all data frames of the non-volatile flash memory.

10. The method of claim 1 wherein said page metadata word is written to a page before a frame is written into the page.

11. The method of claim 1, comprising verifying, by the flash memory control circuitry on each starting of the non-volatile flash memory, an atomicity of a last written data frame.

12. A device, comprising:
a non-volatile flash memory organized into pages divided into frames; and
flash memory control circuitry, which, in operation, controls:
write operations of blocks of data to data frames of the non-volatile flash memory, wherein data frames are written sequentially into pages of the non-volatile flash memory; and
read operations of blocks of data from data frames of the non-volatile flash memory, wherein each data frame is configured to store:
at least one data block; and
at least one first metadata word including one or more index values associated with the at least one data block in an index tree having a plurality of levels, an index value corresponding to an address of a data frame in the non-volatile flash memory, wherein
for each index level of the index tree, only values originating from a previous index level are stored in the at least one first metadata word; and
each page comprises at least one page metadata word which contains, when a page is written into, a value of a counter of a number of written pages, the page to be written into being selected as a page having a page metadata word containing a highest value of the counter of written pages from among all pages in the non-volatile flash memory.

13. The device of claim 12 wherein a value corresponding to an address of the current data frame are stored in the at least one first metadata word.

14. The device of claim 12, comprising:
a volatile memory, wherein one or a plurality of first index levels are processed in the volatile memory.

15. The device of claim 14 wherein all the values of said one or a plurality of first index levels are stored in metadata of each page of the non-volatile flash memory.

16. The device of claim 12 wherein a reading of a desired data block comprises:
reading a last data frame written into the non-volatile flash memory;
tracing back, from data frame to data frame, starting with the last data frame written into the non-volatile flash memory, based on index values associated with the at least one data block of the respective data frames, to identify a data frame containing the desired data block.

17. The device of claim 12 wherein each data frame is configured to store a second metadata word including a logical identifier of a data block stored in the data frame.

18. The device of claim 17 wherein the second metadata word contains a value representative of an error-control code calculated based on at least a data block of the data frame.

19. The device of claim 18 wherein writing to a data frame includes storing a value in a third metadata word of the data frame, wherein the value is independent of content of data blocks to be written to the data frame, and is always the same for a given data frame.

20. The device of claim 19 wherein said third metadata word has a fixed value for all data frames of the non-volatile flash memory.

21. The device of claim 12 wherein the flash memory control circuitry, in operation, verifies, on each starting of the non-volatile flash memory, an atomicity of a last written data frame of the non-volatile flash memory.

22. A system, comprising:
one or more processing cores, which, in operation, process digital data;
a non-volatile flash memory organized into pages divided into frames; and
flash memory control circuitry, which, in operation, controls:
write operations of blocks of data to data frames of the non-volatile flash memory; and
read operations of blocks of data from data frames of the non-volatile flash memory, wherein each data frame is configured to store:
at least one data block; and
at least one first metadata word including one or more index values associated with the at least one data block in an index tree having a plurality of levels, an index value corresponding to an address of a data frame in the non-volatile flash memory, wherein
for each index level of the index tree, only values originating from a previous index level are stored in the at least one first metadata word; and
each page comprises at least one page metadata word which contains, when a page is written into, a value of a counter of a number of written pages, the page to be written into being selected as a page having a page metadata word containing a highest value of the counter of written pages from among all pages in the non-volatile flash memory, wherein data frames are written sequentially into pages of the non-volatile flash memory.

23. The system of claim 22 wherein the one or more processing cores, in operation, process transaction data.

24. A non-transitory computer-readable medium having contents which cause flash memory control circuitry to perform a method, the method comprising:

controlling write operations of blocks of data to data frames of a non-volatile flash memory, the non-volatile flash memory being organized into pages with the pages being divided into frames; and controlling read operations of blocks of data from data frames of the non-volatile flash memory, wherein each data frame is configured to store:

at least one data block; and at least one first metadata word including one or more index values associated with the at least one data block in an index tree having a plurality of levels, an index value corresponding to an address of a data frame in the non-volatile flash memory, wherein for each index level of the index tree, only values originating from a previous index level are stored in the at least one first metadata word; and each page comprises at least one page metadata word which contains, when a page is written into, a value of a counter of a number of written pages, the page to be written into being selected as a page having a page metadata word containing a highest value of the counter of written pages from among all pages in the non-volatile flash memory, wherein data frames are written sequentially into pages of the non-volatile flash memory.

25. The non-transitory computer-readable medium of claim 24 wherein a reading of a desired data block comprises:

reading a last data frame written into the non-volatile flash memory;

identifying a data frame containing the desired data block based on index values associated with the last data frame written into the non-volatile flash memory.

26. The non-transitory computer-readable medium of claim 24 wherein the method comprises verifying, on each starting of the non-volatile flash memory, an atomicity of a last written data frame.

* * * * *